United States Patent
Tokranov et al.

(10) Patent No.: US 11,276,651 B2
(45) Date of Patent: Mar. 15, 2022

(54) IC PRODUCT COMPRISING A SINGLE ACTIVE FIN FINFET DEVICE AND AN ELECTRICALLY INACTIVE FIN STRESS REDUCTION STRUCTURE

(71) Applicant: GLOBALFOUNDRIES U.S. Inc., Santa Clara, CA (US)

(72) Inventors: Anton Tokranov, Cohoes, NY (US); Kai Sun, Clifton Park, NY (US); Elizabeth Strehlow, Malta, NY (US); James Mazza, Saratoga Springs, NY (US); David Pritchard, Glenville, NY (US); Heng Yang, Rexford, NY (US); Mohamed Rabie, Clifton Park, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/876,532

(22) Filed: May 18, 2020

(65) Prior Publication Data
US 2021/0358865 A1 Nov. 18, 2021

(51) Int. Cl.
| H01L 23/00 | (2006.01) |
| H01L 29/06 | (2006.01) |
| H01L 29/66 | (2006.01) |
| H01L 29/423 | (2006.01) |
| H01L 29/78 | (2006.01) |

(52) U.S. Cl.
CPC ........ *H01L 23/562* (2013.01); *H01L 29/0653* (2013.01); *H01L 29/42376* (2013.01); *H01L 29/6681* (2013.01); *H01L 29/7851* (2013.01)

(58) Field of Classification Search
CPC .............. H01L 23/562; H01L 29/0653; H01L 29/42376; H01L 29/6681; H01L 29/7851
See application file for complete search history.

(56) References Cited

U.S. PATENT DOCUMENTS

| 8,881,066 | B2 | 11/2014 | Shieh et al. |
| 10,204,202 | B2 | 2/2019 | Hsieh et al. |
| 10,943,830 | B2* | 3/2021 | Chiang ............... H01L 27/0924 |
| 2018/0004882 | A1 | 1/2018 | Hsieh et al. |
| 2018/0033740 | A1* | 2/2018 | Kuan .................... H01L 29/161 |
| 2019/0067120 | A1* | 2/2019 | Ching ................. H01L 29/7843 |
| 2019/0148407 | A1* | 5/2019 | Guo .................... H01L 27/0924 257/206 |
| 2019/0181145 | A1* | 6/2019 | Wang .............. H01L 21/823431 |
| 2020/0051812 | A1* | 2/2020 | Belyansky .......... H01L 29/6681 |
| 2021/0118816 | A1* | 4/2021 | Kuan ................. H01L 29/6681 |

FOREIGN PATENT DOCUMENTS

DE 102017100783 A1 2/2018

* cited by examiner

*Primary Examiner* — Christine A Enad
(74) *Attorney, Agent, or Firm* — Hoffman Warnick LLC

(57) ABSTRACT

An illustrative device disclosed herein includes a semiconductor substrate and a FinFET transistor device positioned above the semiconductor substrate, wherein the FinFET transistor device has a single active fin structure. The device also includes an electrically inactive dummy fin structure positioned adjacent the single active fin structure, wherein the electrically inactive dummy fin structure is electrically inactive with respect to electrical operation of the FinFET transistor having the single active fin.

17 Claims, 18 Drawing Sheets

IC PRODUCT COMPRISING A SINGLE ACTIVE FIN FINFET DEVICE AND AN ELECTRICALLY INACTIVE FIN STRESS REDUCTION STRUCTURE

BACKGROUND

Field of the Invention

The present disclosure generally relates to various novel embodiments of an integrated circuit (IC) product comprising a single active fin FinFET transistor device and an electrically inactive fin stress reduction structure and methods of making such IC products.

Description of the Related Art

Transistor devices come in a variety of configurations, e.g., planar devices, FinFET devices, vertical devices, etc. FinFET devices are commonly employed in modern IC products. A FinFET device may comprise a single active fin (i.e., a single semiconductor structure) or multiple fins (i.e., multiple semiconductor structures). Such a fin has a long axis that is oriented substantially horizontal relative to an upper surface of the semiconductor substrate on which the FinFET device is formed. Single-fin FinFET devices are becoming more popular in many IC products where low power consumption is important, e.g., mobile phones and portable computing devices. However, at least some of the traditional manufacturing processes used to form devices having a single semiconductor structure (e.g., FinFET and vertical devices) may have a tendency to increase the formation of undesirable crystalline defects in the fin of a single-fin FinFET device, which may lead to a reduction in the performance capabilities of the resulting device. More specifically, in some manufacturing techniques, an oxide material may be initially formed so as to overfill the trenches adjacent the fin. Unfortunately, in some cases, the oxide material exerts a lateral or horizontal stress (in the gate width direction of the FinFET device) on the fin that tends to pull the fin apart. This stress on the fin tends to lead to the formation of the above-mentioned undesirable crystalline defects in the fin.

The present disclosure is generally directed to various novel embodiments of an IC product comprising a single active fin FinFET transistor device and an electrically inactive fin stress reduction structure and methods of making such IC products that may solve or at least reduce one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is directed to various novel embodiments of an IC product comprising a single active fin FinFET transistor device and an electrically inactive fin stress reduction structure and methods of making such IC products. An illustrative device disclosed herein includes a semiconductor substrate and a FinFET transistor positioned above the semiconductor substrate, wherein the FinFET transistor device has a single active fin structure. The device also includes an electrically inactive dummy fin structure positioned adjacent the single active fin, wherein the electrically inactive dummy fin structure is electrically inactive with respect to electrical operation of the FinFET transistor having the single active fin.

Another illustrative device disclosed herein includes a semiconductor substrate and a FinFET transistor positioned above the semiconductor substrate, wherein the FinFET transistor device has a single active fin structure. The device also includes an electrically inactive dummy fin structure, wherein the electrically inactive dummy fin structure is electrically inactive with respect to electrical operation of the FinFET transistor having the single active fin and an isolation structure positioned in the semiconductor substrate between the electrically inactive dummy fin structure and the single active fin structure.

BRIEF DESCRIPTION OF THE DRAWINGS

The disclosure may be understood by reference to the following description taken in conjunction with the accompanying drawings, in which like reference numerals identify like elements, and in which.

Figure 1:
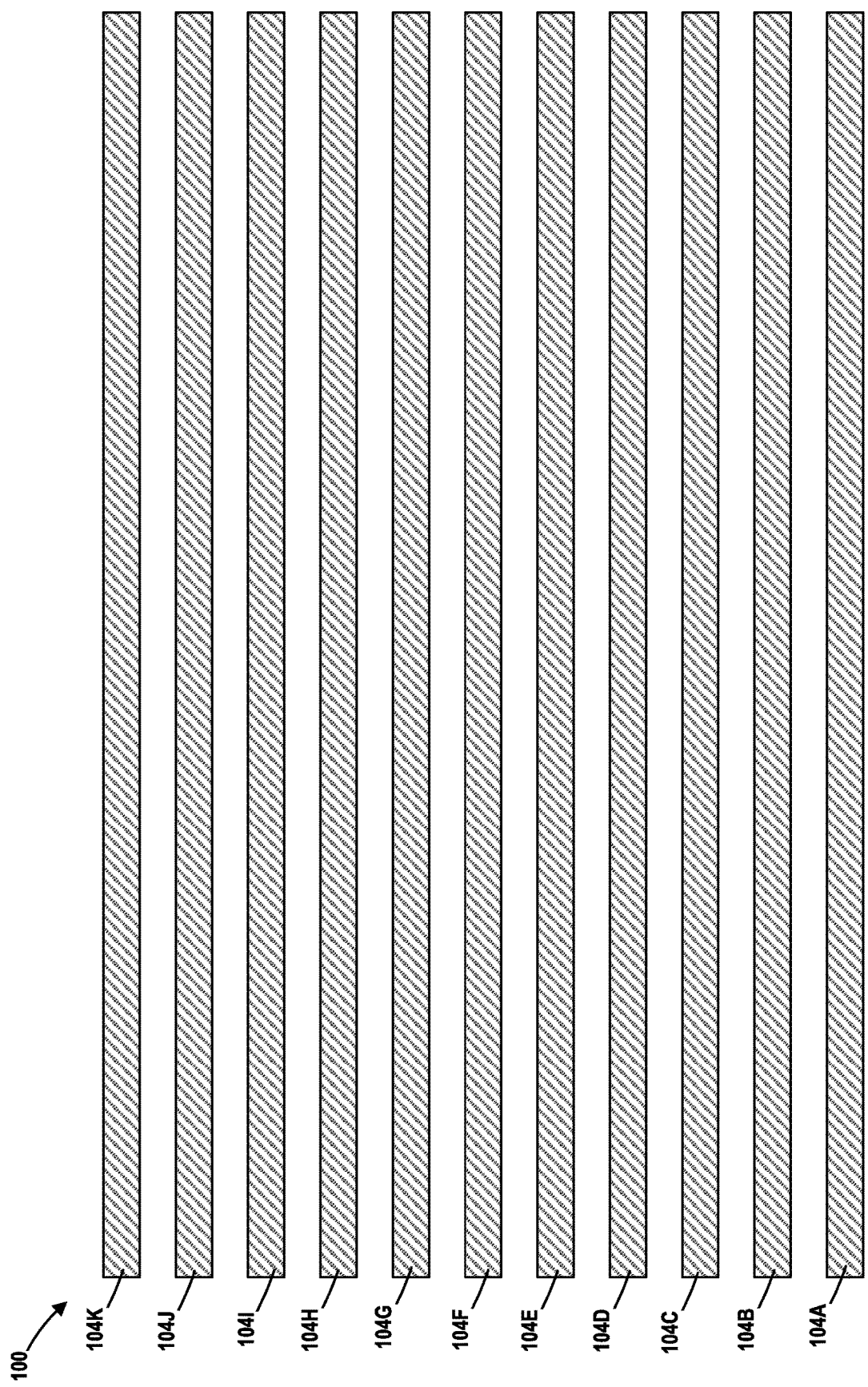
FIGS. 1-18 depict novel embodiments of an IC product comprising a single active fin FinFET transistor device and an electrically inactive fin stress reduction structure and methods of making such IC products. The drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different products, including, but not limited to, logic products, memory devices, etc.

As will also be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application. With reference to the attached figures, various illustrative embodiments of the methods and devices disclosed herein will now be described in more detail. With reference to the attached figures, various illustrative embodiments of the methods and products disclosed herein will now be described in more detail.

FIGS. 1-18 depict various novel embodiments of an IC product 100 comprising a single active fin FinFET transistor device and an electrically inactive fin stress reduction structure as well as various novel methods of making such IC products. The IC product 100 will be formed on and above a semiconductor substrate 102 (see FIG. 2). The semiconductor substrate 102 may have a variety of configurations, such as a bulk silicon configuration. The substrate 102 may also have a semiconductor-on-insulator (SOI) configuration that includes a base semiconductor layer, a buried insulation layer and an active semiconductor layer positioned above the buried insulation layer, wherein transistor devices (not shown) that are formed on the substrate are formed in and above the active semiconductor layer. The substrate 102 may be made of silicon or it may be made of materials other than silicon. Thus, the terms "substrate" or "semiconductor substrate" should be understood to cover all semiconducting materials and all forms of such materials.

Figure 2:
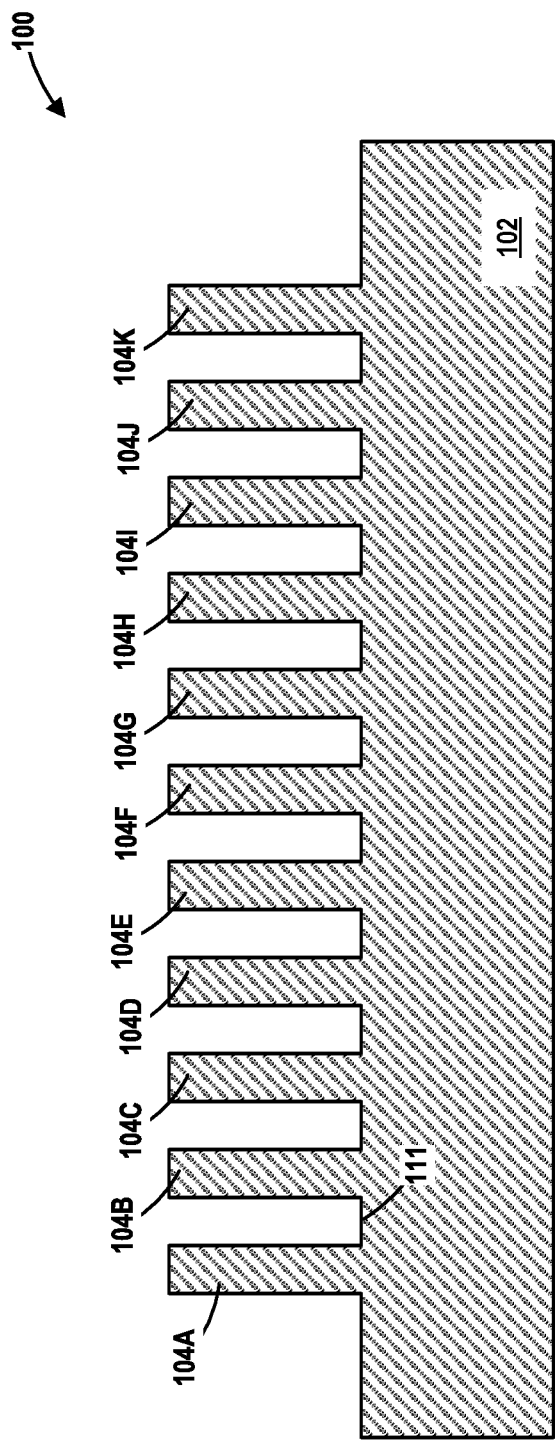

FIG. 1 (plan view) and FIG. 2 (cross-sectional view) depict the IC product 100 after known manufacturing techniques were performed to form a plurality of fins 104A-K (collectively referenced using the numeral 104) in the substrate 102. In one illustrative process flow, the fins 104 are formed across the entirety of the substrate 102. To form the fins 104, a patterned fin-formation etch mask (not shown), e.g., a combination of a silicon dioxide layer (e.g., a pad oxide) and a silicon nitride layer (e.g., a pad nitride), was formed above the substrate 102. Thereafter, one or more etching processes were performed through the patterned fin-formation etch mask so as to define a plurality of fin-formation trenches 111 in the substrate 102. This etching process results in the formation of the fins 104. The patterned fin-formation etch mask will ultimately be removed in later processing operations.

In general, the IC product 100 may comprise a plurality of FinFET transistor devices, wherein each of the FinFET transistor devices may comprise any desired number of fins 104. However, the IC product 100 also includes at least one FinFET transistor device that only has a single active fin 104 that participates in the electrical activity of the FinFET device, i.e., charge carriers (electrons or holes) only flow through a single fin when the device is operational. The FinFET devices disclosed herein may be either N-type or P-type devices. Of course, other devices and structures, e.g., planar transistor devices, vertical transistor devices, resistors, etc., may be present on the IC product as well.

The height and cross-sectional configuration of the fins 104 may also vary depending upon the particular application. In the examples depicted herein, the fins 104 will be depicted as have a simplistic rectangular cross-sectional configuration having a substantially uniform lateral width (in the gate width direction) throughout the height of the fins 104. In a real-world device, the fins 104 may have a tapered cross-sectional configuration, wherein the width of the upper surface of the fin 104 (i.e., the top critical dimension) in the gate width direction of the FinFET device is less than the width of the bottom of the fin 104 in the gate width direction. Additionally, the axial length of the fins 104 may also vary depending upon the particular application, e.g., the axial length of the fins 104 on different transistor devices may be different from one another. Thus, the size and configuration of the fins 104, and the manner in which they are made, should not be considered a limitation of the presently disclosed subject matter. The fins 104 may be formed with any desired fin pitch. Of course, the fins 104 on the IC product may all be formed with a uniform pitch or they may be formed with a non-uniform pitch, some of the fins are formed with a first pitch while other fins are formed with a pitch that is different from the first pitch. More than two different fin pitches may be used on an IC product. Additionally, the gate structures of the FinFET devices disclosed herein may be manufactured using known gate-first or replacement gate manufacturing techniques.

Figure 3:
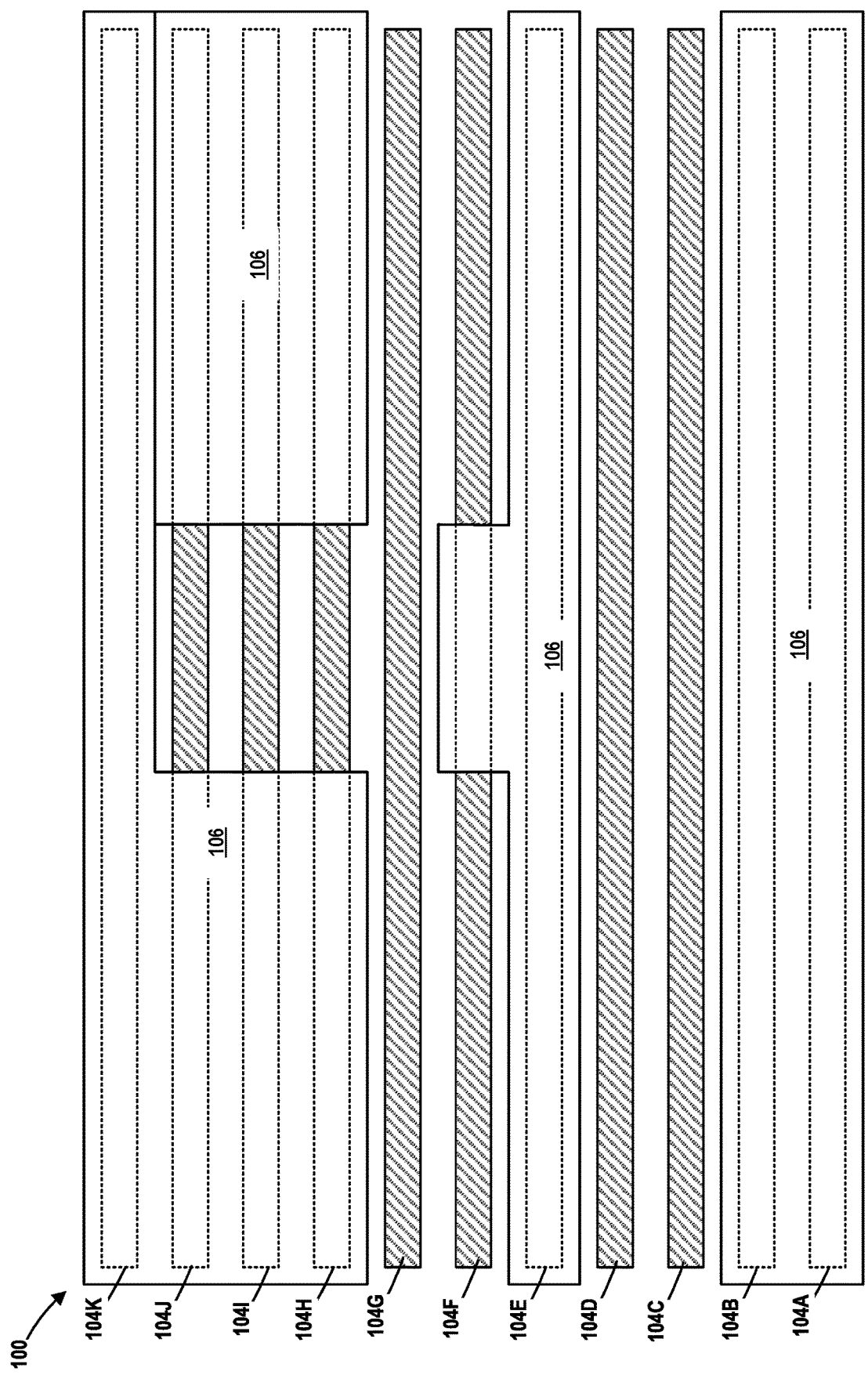

FIG. 3 depicts the IC product 100 after a patterned fin-cut etch mask 106, e.g., a patterned layer of photoresist/BARC, was formed on the product 100 by performing traditional manufacturing techniques. The fin-cut etch mask 106 exposes portions of the fins 104 that are desired to be removed as well as regions where a deep isolation structure will be formed in the substrate 102. As will be described more fully below, in one illustrative embodiment, the fin 104E with be the single active fin 104E for each of a plurality of single-fin FinFET devices, i.e., charge carriers (electrons or holes) only flow through the single active fin 104E of the single-fin FinFET device when the device is operational i.e., turned "ON."

Additionally, a portion of the fin 104F will be an electrically inactive or "dummy" fin stress reduction structure 108 (see FIG. 4) for the single active fin 104E. The dummy fin stress reduction structure 108 is electrically inactive relative to the single-fin FinFET device in the sense that charge carriers (electrons or holes) will not flow through the dummy fin stress reduction structure 108 to any part of the metallization system (or wiring system) on the IC product when the single-fin FinFET device is operational, i.e., turned "ON." Moreover, the dummy fin stress reduction structure 108 is also electrically inactive relative to any other FinFET devices formed on the IC product irrespective of the number of fins such other FinFET devices might have.

Figure 4:
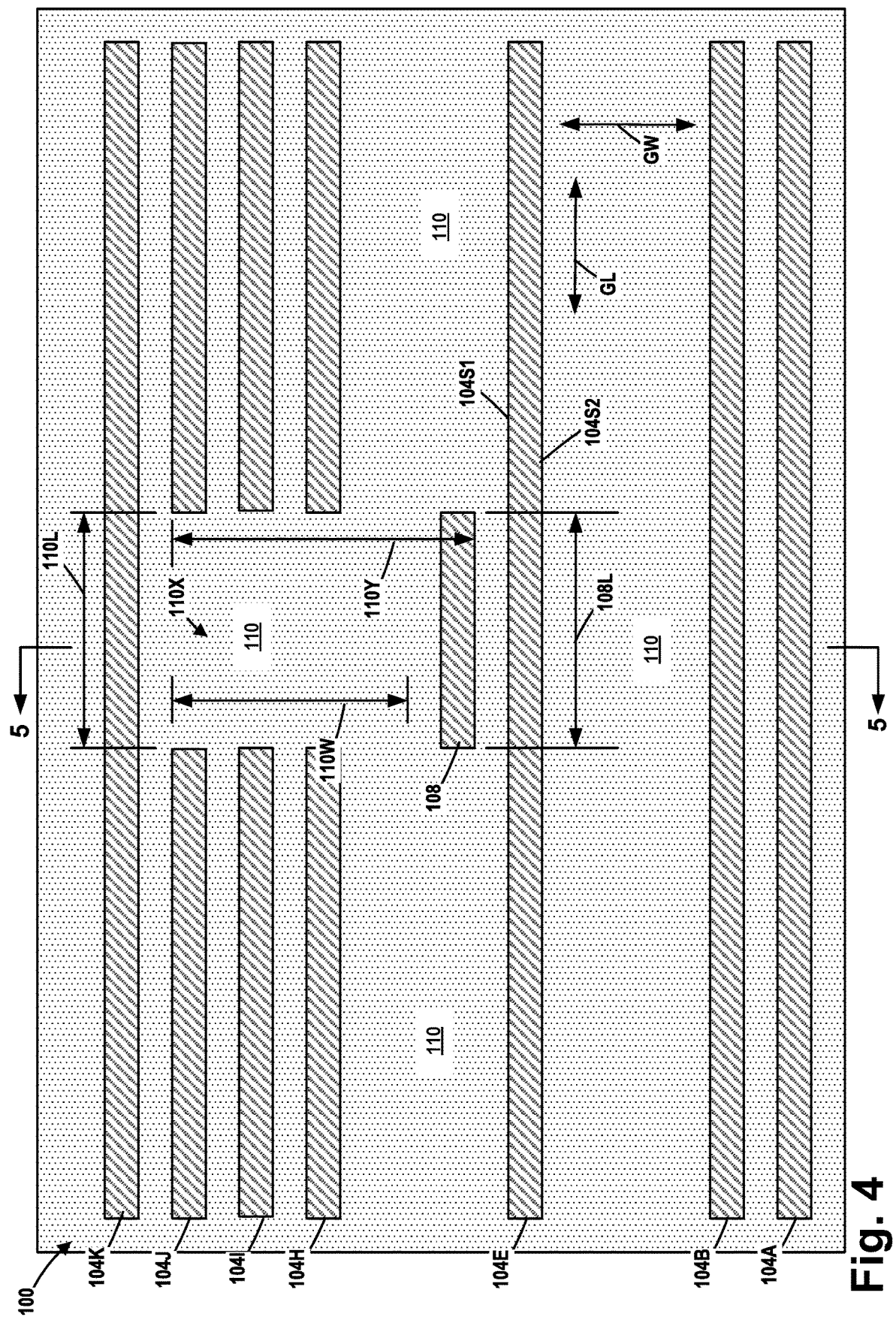
Figure 5:
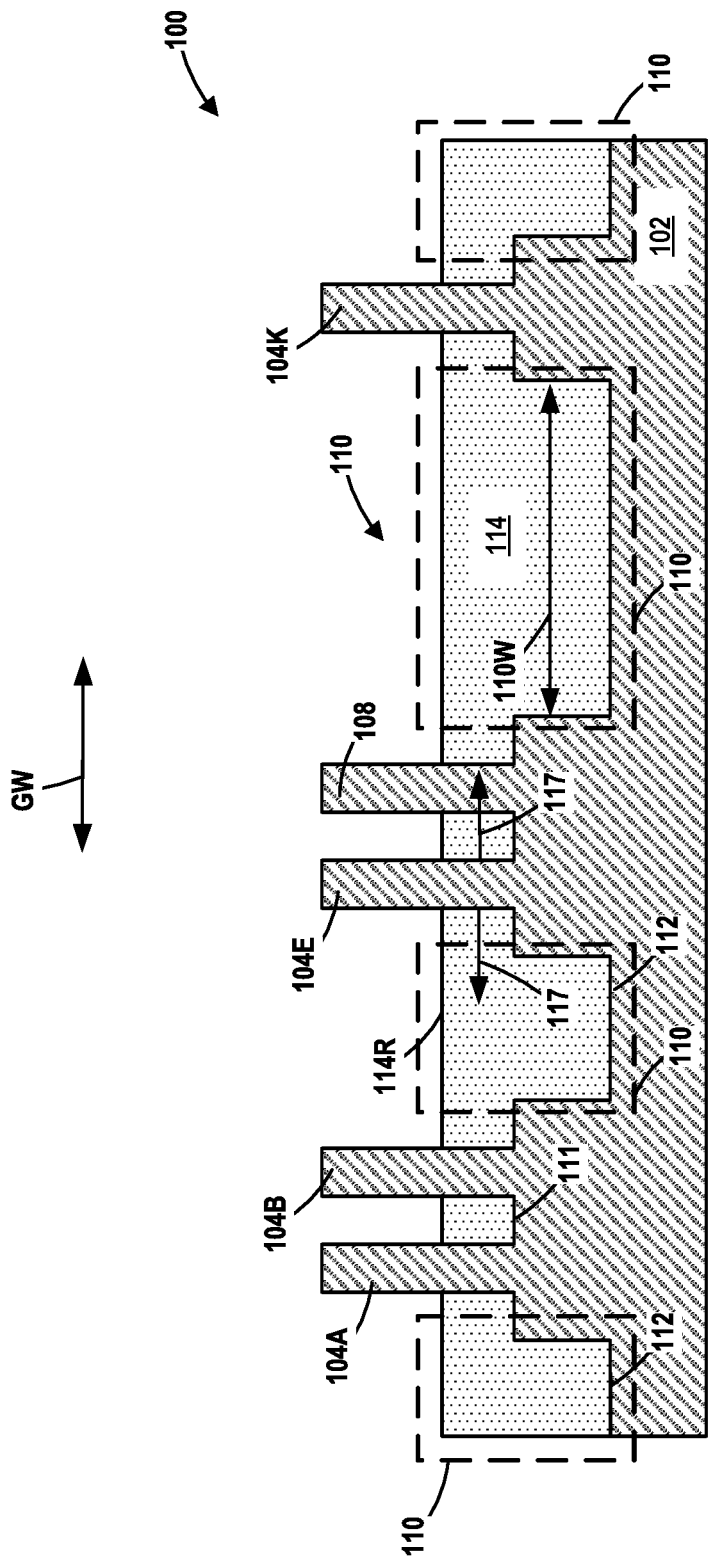

FIG. 4 (plan view) and FIG. 5 (cross-sectional view) depict the IC product 100 after several process operations were performed. First, one or more etching processes were performed through the patterned fin-cut etch mask 106 to remove the exposed portions of the fins 104 and to form deep isolation trenches 112 (see FIG. 5) in the substrate 102. Next, the fin-cut etch mask 106 was removed. Then, a layer of insulating material 114 was formed so as to over-fill the trenches 111 and 112 such that, as initially deposited, the upper surface of the layer of insulating material 114 is above the upper surface of the fins 104. The layer of insulating material 114 may be comprised of, for example, flowable oxide (FCVD), a spin-on oxide (SOD), silicon dioxide, an HDP oxide, or a HARP oxide, etc. At that point, one or more planarization processes (e.g., a CMP and/or etch-back process) was performed to remove portions of the layer of insulating material 114 and expose the upper surface of the fins 104. Next, a timed, recess etching process was performed to remove a portion of the vertical thickness of the layer of insulating material 114. The recess etching process is performed for a sufficient duration such that the layer of insulating material 114 has a substantially planar recessed upper surface 114R that is positioned at a desired height level within the trenches 111. The amount of recessing of the layer of insulating material 114 may vary depending upon the particular application. This recess etching process exposes the desired final fin height of the fins 104 for the FinFET devices. The process operations also result in the formation of a deep isolation structure 110 (comprising the insulating material 114) in the substrate 102 that electrically isolates adjacent transistor devices from one another. As will be appreciated by those skilled in the art, the deep isolation structure 110 comprises the insulating material 114 positioned in and above the deep isolation trenches 112. The deep isolation structure 110 extends to a depth in the substrate below the depth of the fin-formation trenches 111 and the vertical thickness of the insulating material 114 in the deep isolation structure 110 is greater than the vertical thickness of the portion of the insulating material 114 positioned above the fin-formation trenches 111.

With continued reference to FIGS. 4 and 5, the fins 104C, 104D and 104G were completely removed from the depicted portion of the substrate 102. A portion of the axial length of the fins 104H-J was also removed during the fin-cut process. The gate length (GL) and gate width (GW) directions of the final transistor devices are depicted in FIGS. 4 and 5. As noted above, the fin 104E with be the single active fin for each of a plurality of single-fin FinFET devices, while a portion of the fin 104F will become an electrically inactive dummy fin stress reduction structure 108 for the single active fin 104E.

Given the very small dimensions of a single active fin, especially in the gate width direction of the device, such a single active fin 104E is a relatively fragile structure. Moreover, when there are relatively large regions of the deep isolation structure 110 positioned adjacent the single active fin 104E, the insulating material 114 in the deep isolation structure 110 can exert a tensile stress (as indicated by the arrows 117 in FIG. 5) on the fin 104E that tends to pull the fin 104E apart and can result in the formation of stress-induced faults (not shown) in the fin crystalline structure of the fin 104E. Such stress-induced faults in the single active fin 104E can lead to reductions in the operational performance of the final FinFET device. More specifically, in some applications, one or more wet or dry anneal processes may be performed on the layer of insulating material 114 after it is formed. In some cases, the layer of insulating material 114 may contract about 5-15% during one or more of these anneal processes. The contraction of the layer of insulating material 114 results in the tensile stress 117 that is exerted on the single active fin 104E. The purpose of the dummy fin stress reduction structure 108 is to reduce the stress exerted on the single active fin 104E and thereby reduce the chances of stress-induced faults being formed in the single active fin 104E. In the example depicted in FIGS. 4 and 5, the dummy fin stress reduction structure 108 is positioned within the same cell where the single active fin 104E is located. However, as will be described more fully below, in some applications, the dummy fin stress reduction structure 108 may be positioned in a cell other than the cell that contains the single active fin 104E.

With reference to FIG. 4, there is a relatively large portion 110X of the deep isolation structure 110 positioned between the fin 104E and the fin 104K and between the cut ends of the fins 104H-J. Absent the formation of the dummy fin stress reduction structure 108, the dimension (in the gate width direction) of the portion 110X of the deep isolation structure 110 that exerts a stress on the single active fin 104E would be the dimension 110Y. However, due to the formation of the dummy fin stress reduction structure 108, the dimension (in the gate width direction) of the portion 110X of the deep isolation structure 110 that exerts a stress on the single active fin 104E is reduced to the dimension 110W. The dimension 110L of the portion 110X of the deep isolation structure 110 (in the gate length direction) is the same in both situations.

As a result of forming the dummy fin stress reduction structure 108 between the single active fin 104E and the portion 110X of the deep isolation structure 110, there is a reduced volume of the insulating material 114 in the portion 110X of the deep isolation structure 110 and therefore less stress 117 is exerted on the single active fin 104E. The dummy fin stress reduction structure 108 also acts to reduce the stress acting on the single active fin 104E by providing mechanical support to the single active fin 104E. That is, in the absence of the dummy fin stress reduction structure 108, the stress generated by the portion 110X of the deep isolation structure 110 would act on only the single active fin 104E. However, with the dummy fin stress reduction structure 108 in position, the stress generated by the portion 110X of the deep isolation structure 110 now acts on two fins—the single active fin 104E and the dummy fin stress reduction structure 108. Stated another way, the stress generated by the portion 110X of the deep isolation structure 110 remains the same but the stress now acts on a larger area, thereby spreading out the stress among the two fins. As a result, the strain in the single active fin 104E (and the dummy fin stress reduction structure 108) is reduced, which should lead to a reduction of strain-induced defects in the single active fin 104E.

In the illustrative example depicted is FIGS. 1-7, the single active fin 104E is formed with a first fin pitch and the dummy fin stress reduction structure 108 is formed a single fin pitch away from the single active fin 104E. For the embodiment shown in FIGS. 1-7, simulation data indicates that formation of the dummy fin stress reduction structure 108 may reduce the maximum strain energy density (MPa) on the single active fin 104E by as much as about 10% and may reduce the average strain energy density (MPa) on the single active fin 104E by about 14.5%. Moreover, the strain reduction may occur along the axial length (in the gate length direction) of the single active fin 104E for a dimension that is greater than the axial length 108L of the dummy fin stress reduction structure 108.

Of course, several different single-fin FinFET devices may be formed on the single active fin 104E. The physical dimensions of the dummy fin stress reduction structure 108, e.g., its axial length 108L (in the gate length direction), may vary depending upon the particular application. In one illustrative embodiment, the axial length 108L of the dummy fin stress reduction structure 108 may be substantially equal to the dimension 110L (in the gate length direction) of the portion 110X of the deep isolation structure 110. In other applications, the axial length 108L may be different from, i.e., less than or greater than the dimension 110L. In this particular embodiment, the dummy fin stress reduction structure 108 is a portion of an adjacent fin, e.g., the fin 104F, that was formed one fin pitch away from the single active fin 104E, but that may not be the case in all applications, as will be discussed more fully below.

In the example depicted in FIG. 4, the single active fin 104E comprises opposing first and second sidewalls 104S1 and 104S2, respectively, wherein the sidewall 104S1 is positioned nearer to the portion 110X of the deep isolation structure 110 than the second sidewall 104S2. In one embodiment, the dummy fin stress reduction structure 108 may be formed adjacent the first sidewall 104S1 of the single active fin 104E. In this situation, when viewed from above, at least a portion of the dummy fin stress reduction structure 108 is positioned between the single active fin 104E and the portion 110X of the deep isolation structure 110. However, in other applications, the dummy fin stress reduction structure 108 may be formed adjacent the opposite side 104S2 of the single active fin 104E. In this latter situation, the dummy fin stress reduction structure 108 still reduces the stress applied to the single active fin 104E by providing mechanical support, i.e., reinforcing the single active fin 104E, without reducing the volume of the insulating material 114 positioned in the portion 110X of the deep isolation structure 110. In even other applications, an electrically inactive dummy fin stress reduction structure 108 may be formed adjacent both sides 104S1, 104S2 of the single active fin 104E. In this situation, the fin stress reduction structures 108 formed on opposite sides of the fin 104E need not have the same physical dimensions, but that may the case in some applications.

Figure 6:
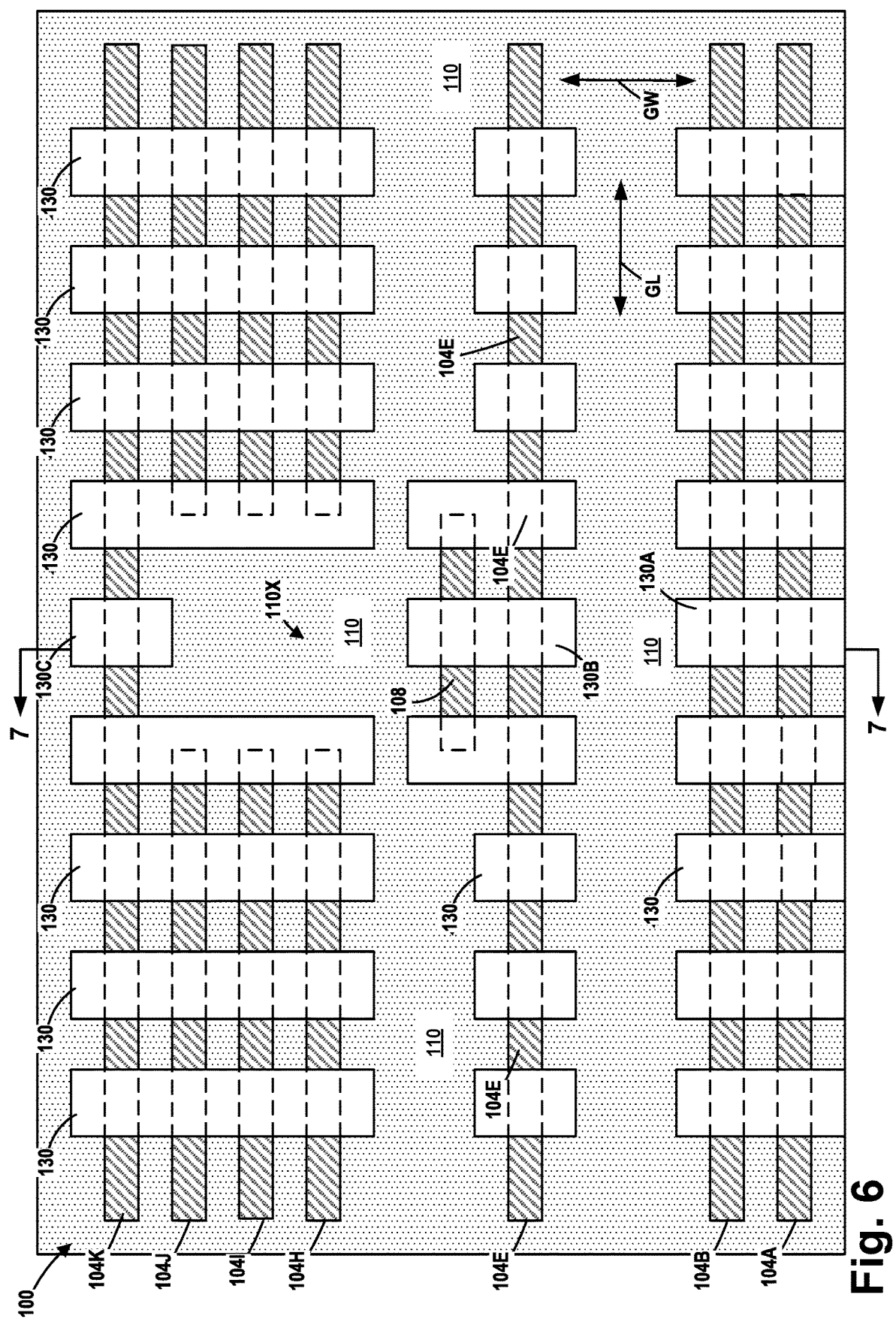
Figure 7:
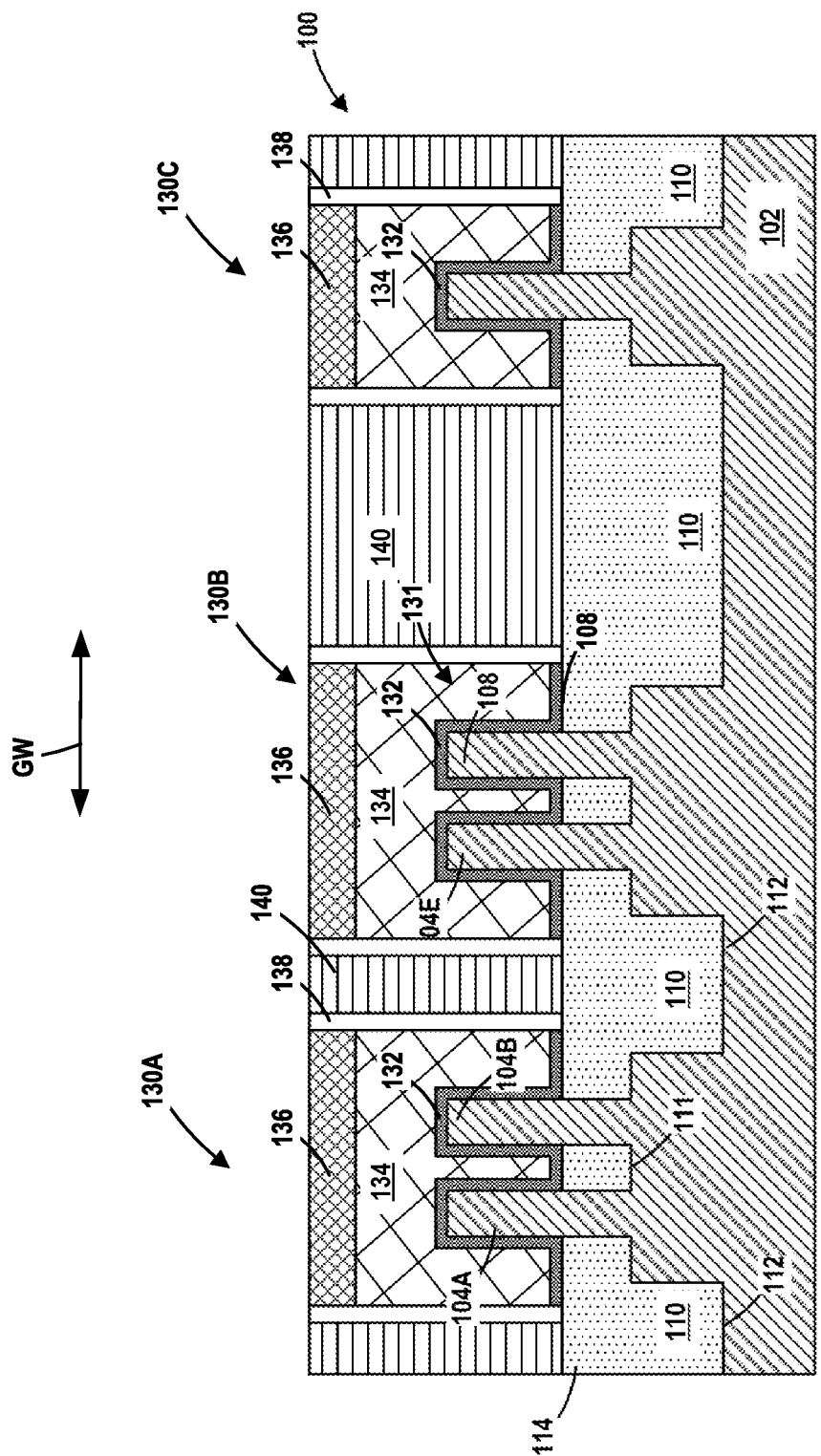
Figure 8:
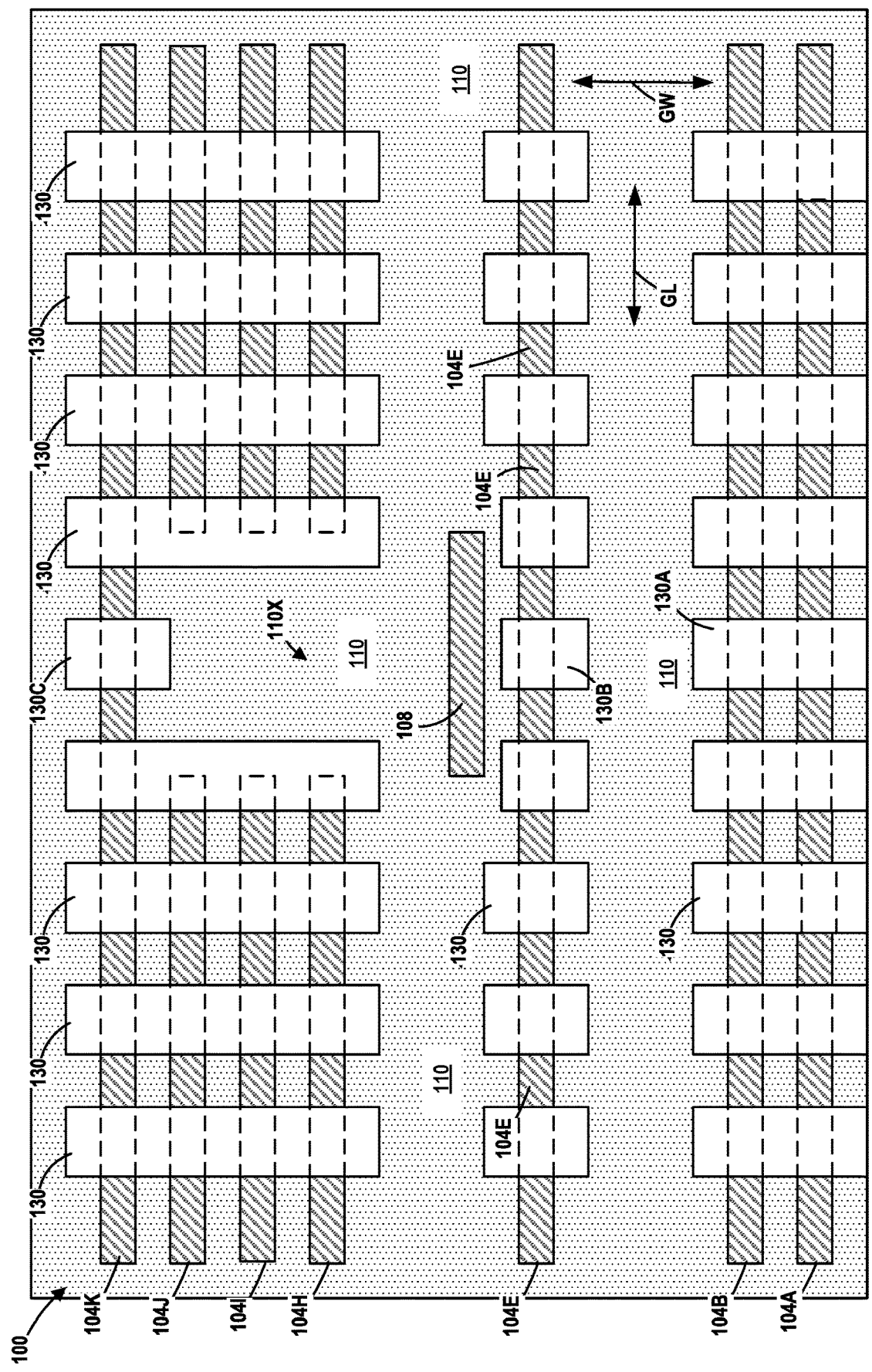

As will be appreciated by those skilled in the art after a complete reading of the present application, a conductive gate structure may or may not be formed over the electrically inactive dummy fin stress reduction structure 108. FIG. 6 (plan view) and FIG. 7 (cross-sectional view) depicts the IC product after simplistically depicted gates 130 were formed on the IC product 100 and wherein a gate 130B was formed above the dummy fin stress reduction structure 108 and the single active fin 104E. FIG. 8 (plan view) depicts an embodiment of the IC product wherein the gate 130B is only formed above the single active fin 104E (a cross-sectional view of this embodiment has not been provided). As noted above, the gate structures for the gates 130 for the transistor devices disclosed herein may be formed by performing gate-first or replacement gate manufacturing techniques. The gates 130 shown in the cross-sectional view shown in FIG. 7 have been labeled with the numerals 130A-C for reference purposes. With reference to FIG. 7, each of the gates 130 comprises a gate structure 131, a sidewall spacer 138 and a gate cap 136 as described more fully below. With reference to FIG. 7, in one illustrative replacement-gate manufacturing technique, a so-called "dummy" or sacrificial gate structure (not shown) including an initial (or sacrificial) gate cap layer is initially formed above the substrate 102 and patterned. Thereafter, at least one sidewall spacer 138 was formed adjacent the patterned dummy gate structure/cap layer. The dummy gate structure remains in place as many process operations are performed to form the devices, e.g., the formation of raised, doped source/drain regions, performing an anneal process to repair damage to the substrate, etc. At some point in such a replacement-gate process flow, the initial gate cap layer is removed by performing a chemical mechanical polishing (CMP) process relative to a layer of insulating material 140 so as to expose the dummy gate structure for further processing. Thereafter, one or more etching processes are performed to remove the dummy gate structure, which results in the formation of a gate cavity (not shown) that is laterally defined by the internal surfaces of the spacer 138.

Next, various process operations are performed to form an illustrative final gate structure 131 and a final gate cap 136 for each of the FinFET devices. For example, after the dummy gate is removed, a conformal chemical vapor deposition (CVD) or atomic layer deposition (ALD) process may be performed to form a conformal gate insulation layer 132 comprised of a high-k layer of insulating material, e.g., hafnium oxide, silicon dioxide, etc., in the gate cavity. Thereafter, one or more metal or metal alloy layers and/or polysilicon layers (that will become the gate electrode 134) may be deposited in the gate cavity above the gate insulation layer 132. A CMP process is then performed to remove excess portions of the deposited layers of material positioned outside the gate cavity and above the layer of insulating material 140. These operations result in the schematically depicted final gate structures 131. After the materials of the final replacement gate structures 131 were formed in the gate cavities, a timed, recess etching process was performed to recess the materials of the final replacement gate structure 131 so as to thereby make room for the final gate cap 136 to be formed in the replacement gate cavities above the recessed materials of the final replacement gate structures 131. The gate cap 136 was formed by depositing a layer of gate cap material, e.g., silicon nitride, across the substrate and in the gate cavities above the recessed materials of the final replacement gate structures 131 and thereafter performing a CMP process to remove the excess gate cap material positioned above the upper surface of the layer of insulating material 140. Of course, the materials of construction for the gate structures 131 for an NFET device and a PFET device may be different. The gate structures 131 depicted herein are intended to be representative in nature in that they are intended to represent any type of gate structure that may be formed on an IC product. Note that, in one illustrative embodiment, the gate structure 131 is positioned around the single active fin 104E and around the dummy fin stress reduction structure 108.

Figure 9:
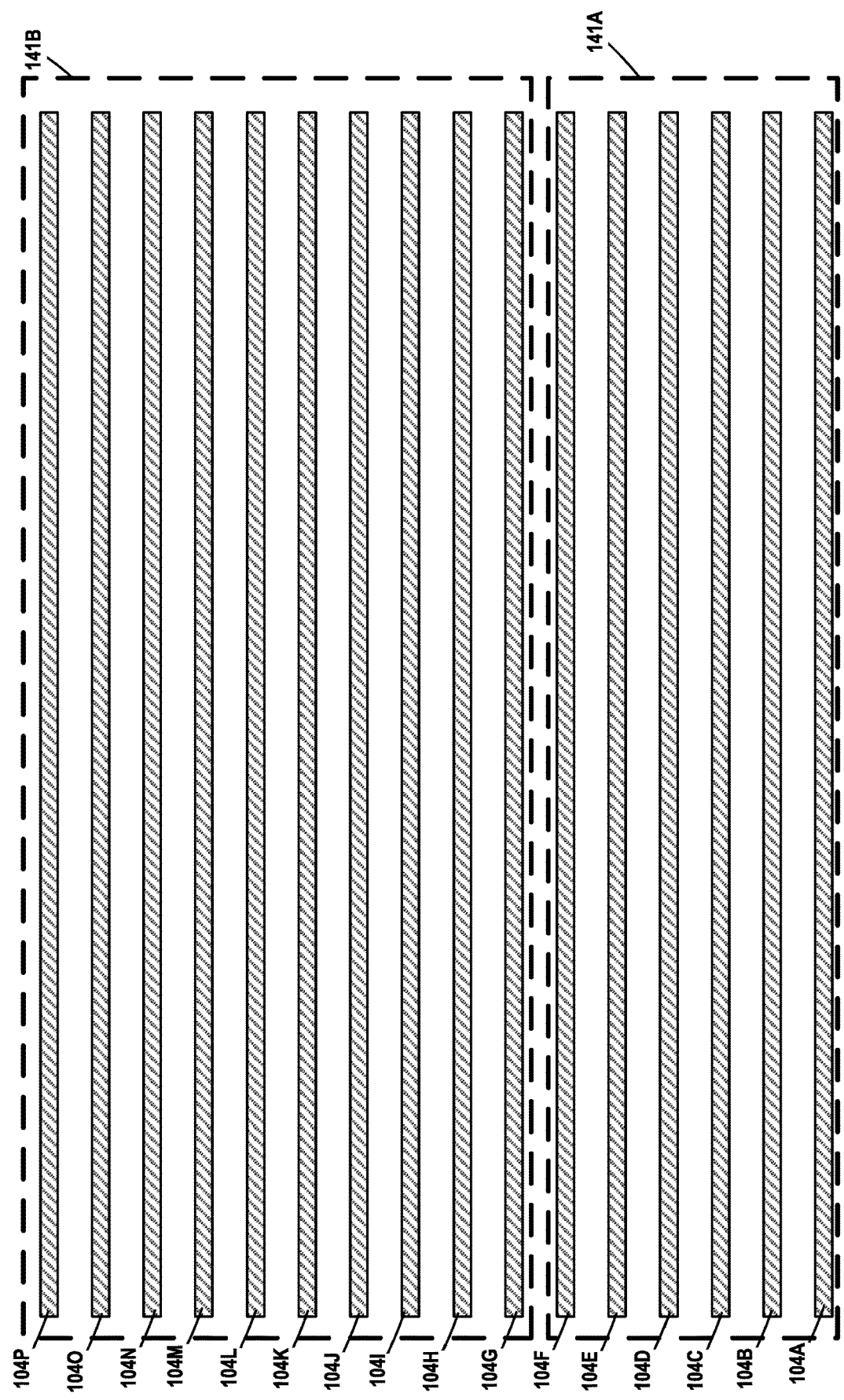
Figure 10:
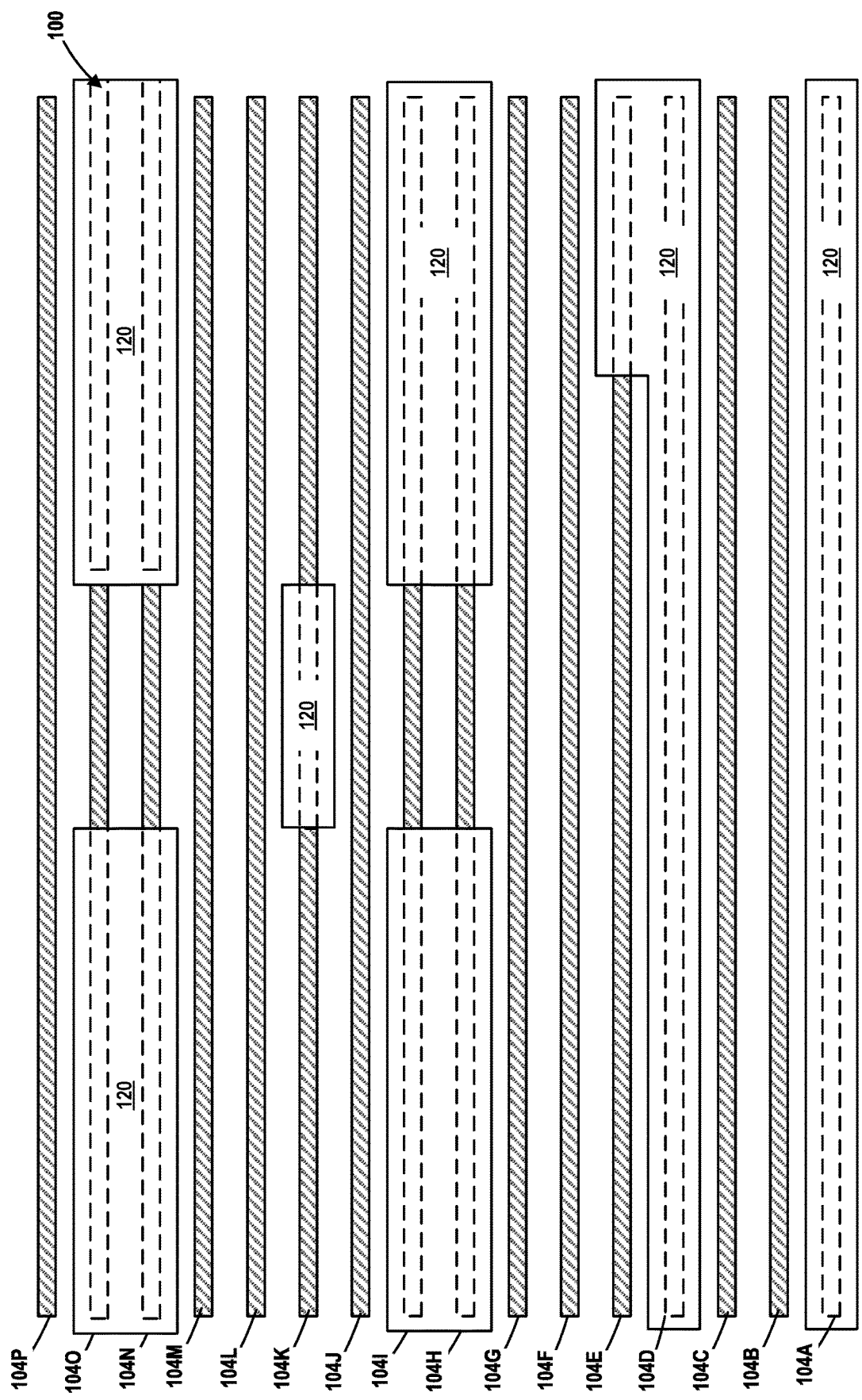
Figure 11:
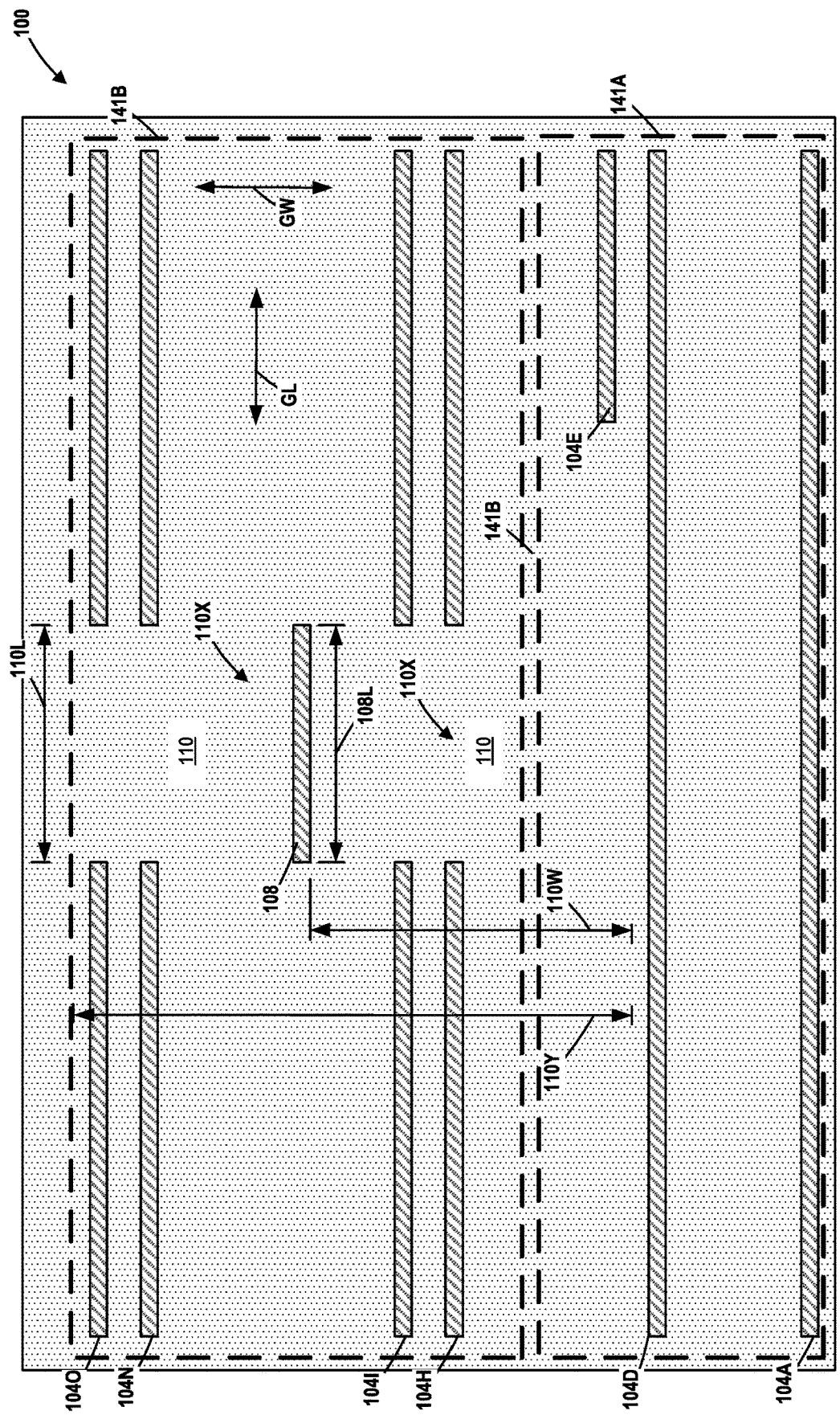

FIGS. 9-11 depict another illustrative embodiment of an IC product 100 wherein the dummy fin stress reduction structure 108 is formed a more remote distance from the single active fin of the single active fin FinFET device. In this particular example, the IC product 100 comprises a portion of a simplistically depicted first cell 141A and a portion of a simplistically depicted second cell 141B (collectively referenced using the numeral 141). In one illustrative example, each of the cells 141 include a plurality of NFET and a plurality of PFET devices. As will be understood by those skilled in the art, a real-world IC product 100 may contain multiple millions of such cells 141, and the cells 141 may have a variety of different configurations as well as a variety of different physical sizes, e.g., small cells, large cells, very large cells, etc. In one embodiment, the cells 141 may be what are referred to as a standard cell. Such a standard cell is a collection or arrangement of a plurality of NFET and a plurality of PFET devices with a fixed height and a width equal to a multiple of the contacted poly pitch of the technology node. In some applications, the cells are designed so that the cells can be aligned next to one another without violating minimum ground rules for the particular technology node. As will be appreciated by those skilled in the art after a complete reading of the present application, in one illustrative embodiment, the dummy fin stress reduction structure 108 may be formed in any of a variety of different areas of the IC product, e.g., a power rail region inside a particular cell, a shared power rail region between two cells at the boundary of the cells, a pickup region wherein the gate structure is contacted, etc.

In one particular embodiment, a single electrically active fin 104 for the FinFET devices will be formed in the first cell 141A while the dummy fin stress reduction structure 108 for the single active fin 104E will be formed in the second cell 141B. FIG. 9 depicts the IC product 100 after known manufacturing techniques were performed to form a plurality of fins 104A-P (collectively referenced using the numeral 104) in the substrate 102. The fins 104A-F are formed within the depicted portion of the first cell 141A, while the fins 104G-P are formed within the depicted portion of the second cell 141B. The fins 104 may be formed using the techniques described above.

FIG. 10 depicts the IC product 100 after a patterned fin-cut etch mask 120, e.g., a patterned layer of photoresist/BARC, was formed on the product 100 by performing traditional manufacturing techniques. As before, this fin-cut etch mask 120 exposes portions of the fins 104 that are desired to be removed as well as regions where a deep isolation structure 110 will be formed in the substrate 102. As will be described more fully below, in this illustrative example, the fin 104D (in cell 141A) will be the single active fin for each of a plurality of single-fin FinFET devices, while a portion of the fin 104K (in cell 141B) will be the electrically inactive dummy fin stress reduction structure 108 for the single active fin 104D.

FIG. 11 depicts the IC product 100 after several process operations were performed. First, one or more etching processes were performed through the patterned fin-cut etch mask 120 to remove the exposed portions of the fins 104 and to form deep isolation trenches 112 (not shown) in the substrate 102. Next, the fin-cut etch mask 120 was removed. Then, a layer of insulating material 114 was formed as described above and recessed as described above. This recess etching process exposes the desired final fin height of the fins 104 for the FinFET devices. As before, these process operations also result in the formation of a deep isolation structure 110 in the substrate 102 that electrically isolates adjacent transistor devices from one another. In the illustrative example depicted in FIG. 10, the single active fin 104D is formed with a first fin pitch and the dummy fin stress reduction structure 108 is formed a distance away from the single active fin 104D, wherein the distance is equal to a plurality of first fin pitches.

With continued reference to FIG. 11, the fins 104B 104C, 104F, 104G, 104J, 104L, 1004M and 104P were completely removed from the depicted portion of the substrate 102. A portion of the axial length of the fins 104E, 104H, 104I, 104K, 104N and 104O was also removed during the fin-cut process. As noted above, in this embodiment, the fin 104D will be the single active fin for each of a plurality of single-fin FinFET devices, while a portion of the fin 104K is the electrically inactive dummy fin stress reduction structure 108 for the single active fin 104D.

As before, there is a relatively large portion 110X positioned adjacent the single active fin 104D and between the cut ends of the fins 104H-I and the fins 104N-O. Absent the formation of the dummy fin stress reduction structure 108, the dimension (in the gate width direction) of the overall portion 110X of the deep isolation structure 110 that exerts stress on the single active fin 104D would be the dimension 110Y. However, due to the formation of the dummy fin stress reduction structure 108, the dimension (in the gate width direction) of the portion 110X of the deep isolation structure 110 that exerts stress on the single active fin 104D is reduced to the dimension 110W. That is, due to the formation of the dummy fin stress reduction structure 108, the portion 110X (e.g., the lower half) of the deep isolation structure 110 that exerts stress on the single active fin 104D structure is positioned between the dummy fin stress reduction structure 108 and the single active fin 104E. As before, the dimension 110L of the portion 110X of the deep isolation structure 110 is the same in both situations. As before, forming the dummy fin stress reduction structure 108 between the fin 104D and the fin 104P effectively reduces the volume of the insulating material 114 in the portion 110X of the deep isolation structure 110 that exerts stress on the single active fin 104D and therefore less stress 117 is exerted on the single active fin 104D.

Figure 12:
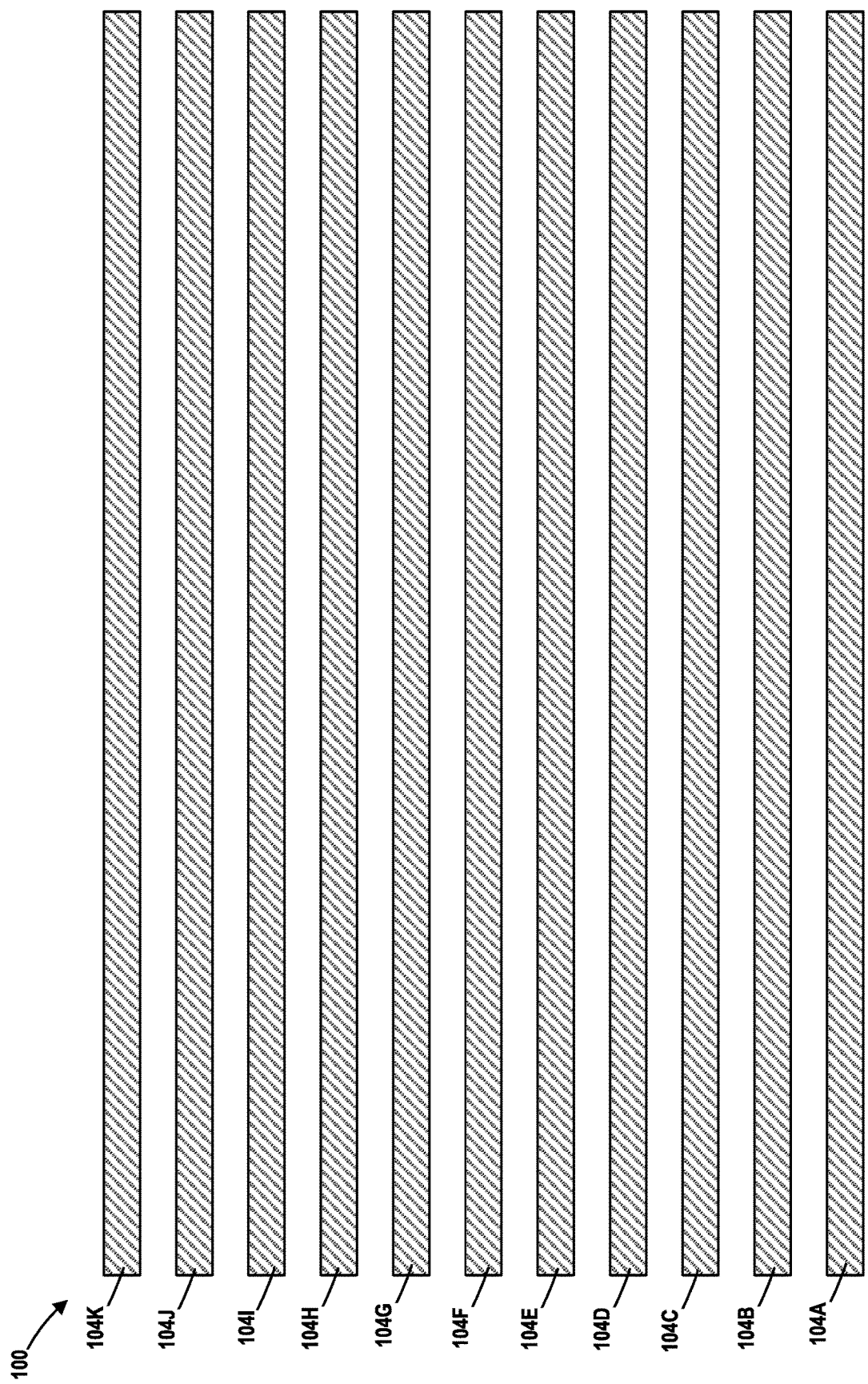

FIGS. 12-18 depict another illustrative embodiment of an IC product 100 that includes a dummy fin stress reduction structure 108 on the IC product 100, wherein the dummy fin stress reduction structure 108 will be formed in a pick-up region of the IC product. Additionally, this embodiment will reflect the flexibility in terms of positioning the dummy fin stress reduction structure 108 at various locations on the IC product so as to not adversely affect the performance of the transistor devices. FIG. 12 depicts the IC product 100 after known manufacturing techniques were performed to form a plurality of fins 104A-K (collectively referenced using the numeral 104) in the substrate 102. The fins 104 may be formed using the techniques described above.

Figure 13:
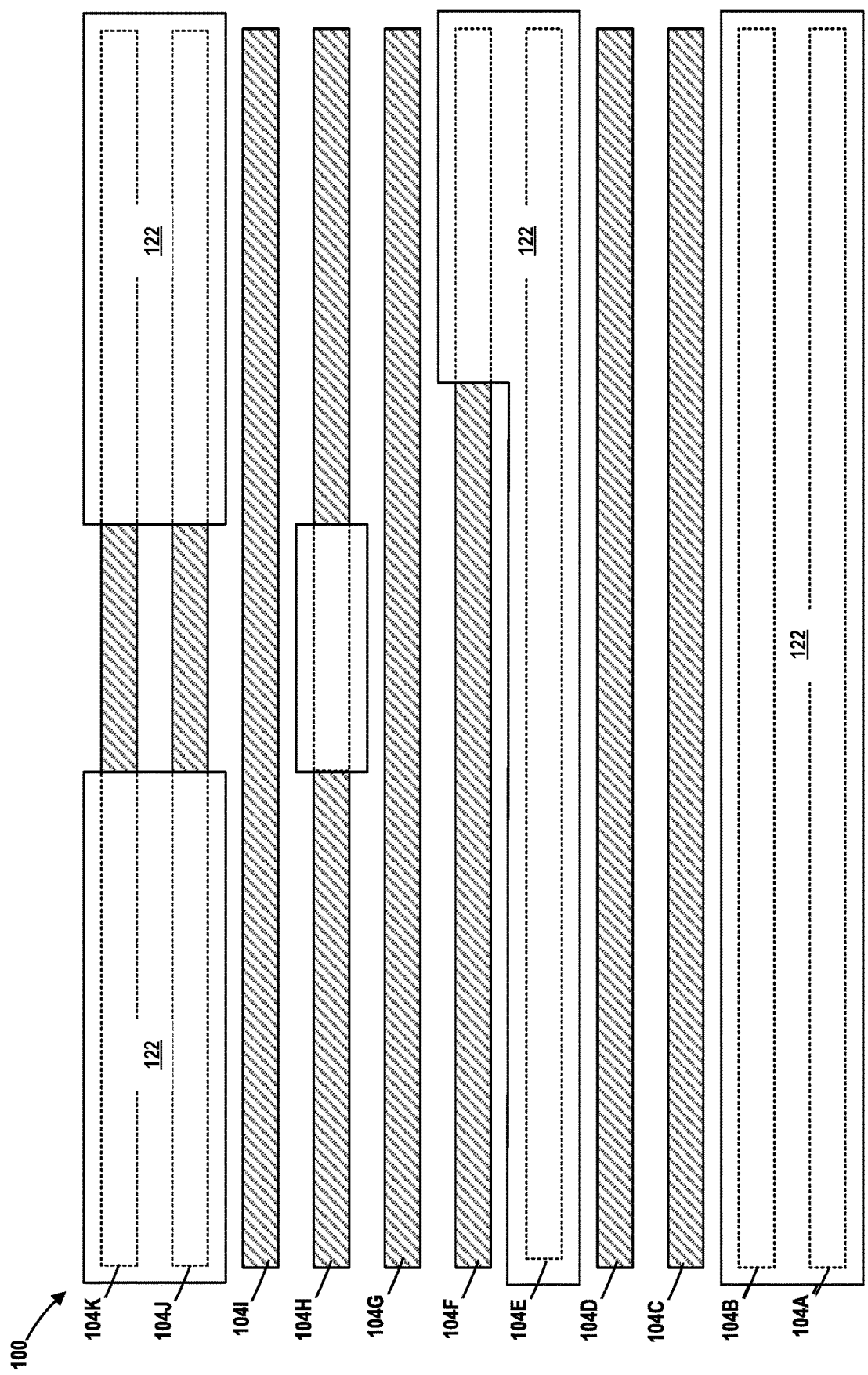

FIG. 13 depicts the IC product 100 after a patterned fin-cut etch mask 122, e.g., a patterned layer of photoresist/BARC, was formed on the product 100 by performing traditional manufacturing techniques. As before, this fin-cut etch mask 122 exposes portions of the fins 104 that are desired to be removed as well as regions where a deep isolation structure 110 will be formed in the substrate 102. As will be described more fully below, in this illustrative example, the fin 104E with be the single active fin for each of a plurality of single-fin FinFET devices, while a portion of the fin 104H will be an electrically inactive dummy fin stress reduction structure 108 for the single active fin 104D.

Figure 14:
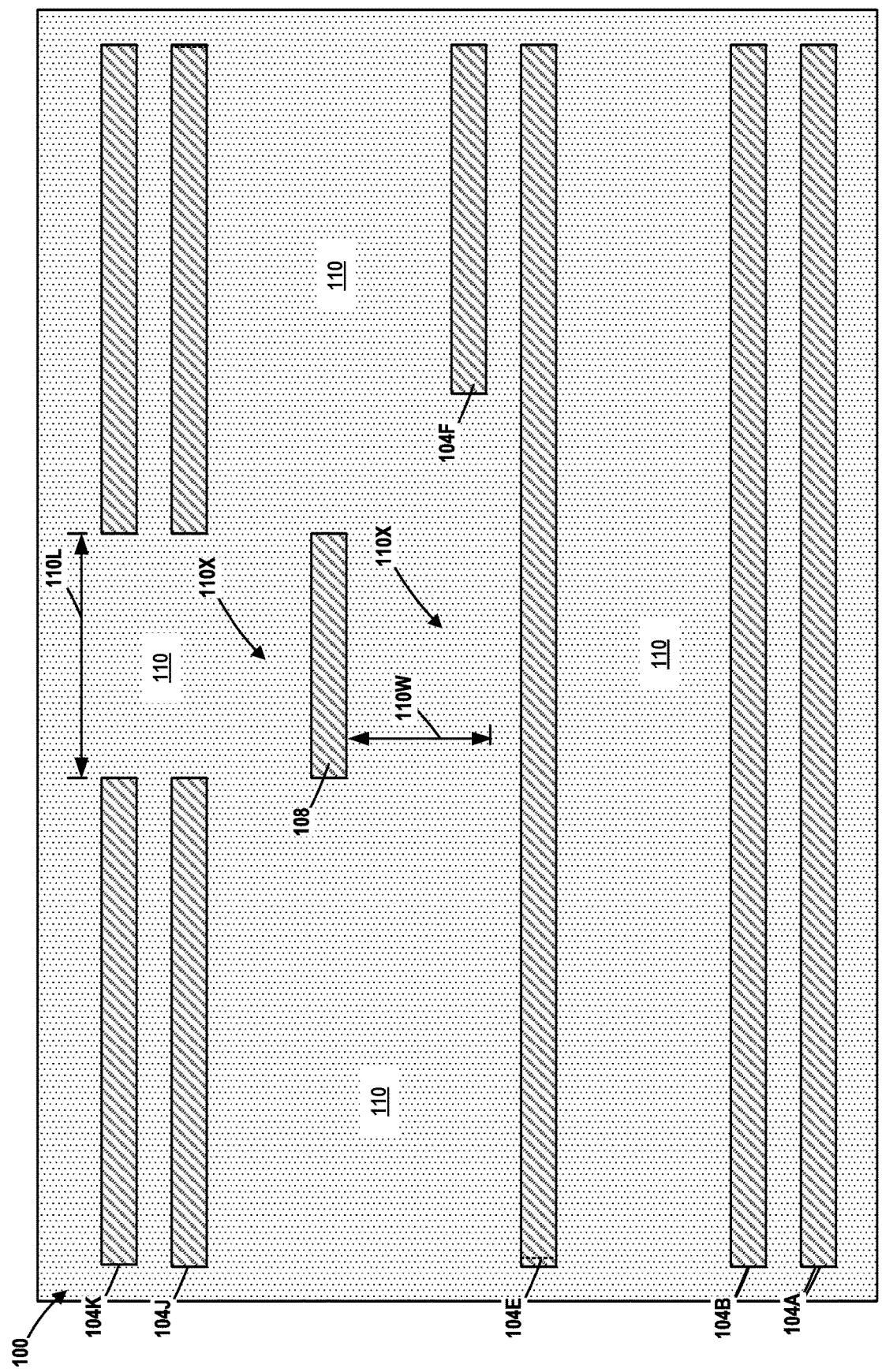

FIG. 14 depicts the IC product 100 after several process operations were performed. First, one or more etching processes were performed through the patterned fin-cut etch mask 122 to remove the exposed portions of the fins 104 and to form deep isolation trenches 112 (not shown) in the substrate 102. Next, the fin-cut etch mask 122 was removed. Then, a layer of insulating material 114 was formed as described above and recessed as described above. This recess etching process exposes the desired final fin height of the fins 104 for the FinFET devices. As before, these process operations also result in the formation of a deep isolation structure 110 in the substrate 102 that electrically isolates adjacent transistor devices from one another.

With continued reference to FIG. 14, the fins 104C, 104D, 104G and 104I were completely removed from the depicted portion of the substrate 102. A portion of the axial length of the fins 104F, 104H, 104J and 104K was also removed during the fin-cut process. As noted above, in this embodiment, the fin 104E will be the single active fin for each of a plurality of single-fin FinFET devices, while a portion of the fin 104H is the electrically inactive dummy fin stress reduction structure 108 for the single active fin 104E.

As before, there is a relatively large portion 110X of the deep isolation structure 110 positioned adjacent the single active fin 104E and between the cut ends of the fin 104H and the fins 104J-K. As before, due to the formation of the dummy fin stress reduction structure 108, the dimension (in the gate width direction) of the portion 110X of the deep isolation structure 110 that exerts stress on the single active fin 104E is reduced to the dimension 110W. As before, forming the dummy fin stress reduction structure 108 effectively reduces the volume of the insulating material 114 in the portion 110X of the deep isolation structure 110 that exerts stress on the single active fin 104E and therefore less stress 117 is exerted on the single active fin 104E.

Figure 15:
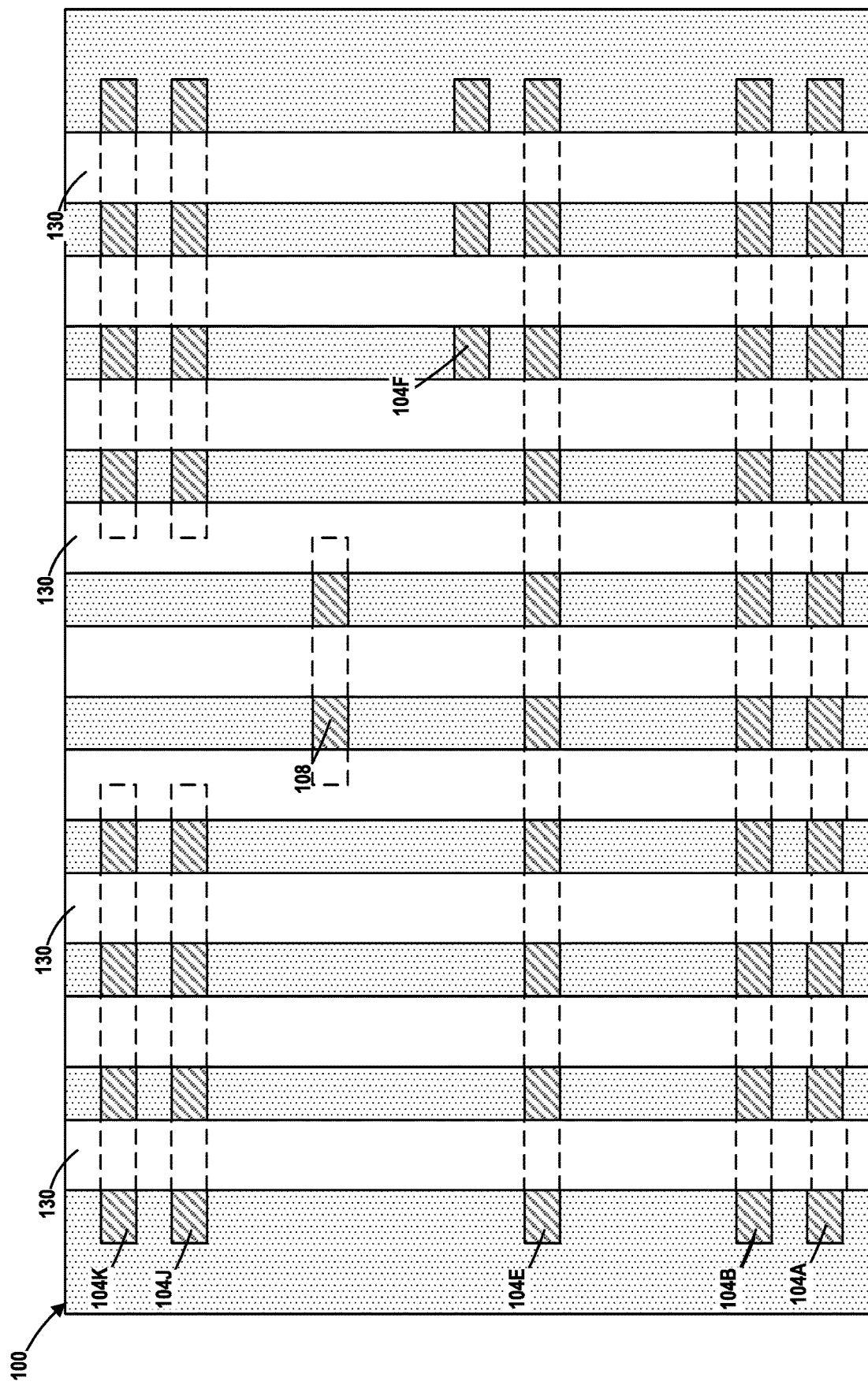

FIG. 15 depicts the IC product after the above-described gates 130 were formed on the IC product 100. As is typical, the gates 130 are initially formed as elongated line-type structures. At some point during the process of manufacturing the IC product 100, the initial gates 130 shown in FIG. 15 will be cut to a desired axial length so as to form individual gates for various transistor devices.

Figure 16:
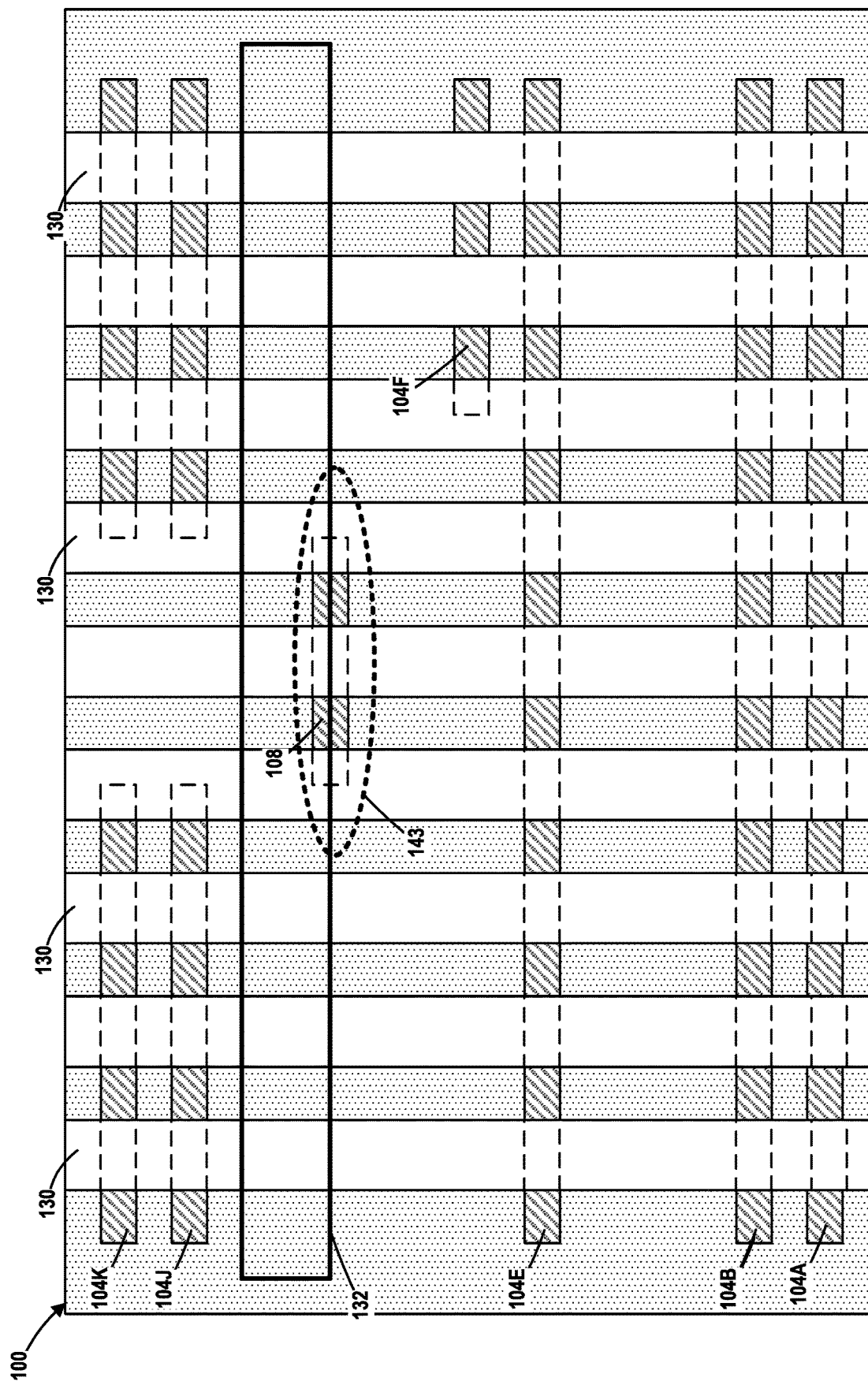

Accordingly, FIG. 16 depicts the location of an opening 132 in a potential patterned gate-cut masking layer (layer not shown) where the gates 130 will be cut. As shown in FIG. 15, the opening 132 is positioned above a portion of the dummy fin stress reduction structure 108. Thus, if the gate cut operations were performed through the opening 132, the ends of the gates 130 in the dashed line region 143 would contact the dummy fin stress reduction structure 108. Such a situation would create an undesirable capacitor structure that would charge and discharge every time the affected gate structures are energized, thereby reducing device performance. Thus, performing the gate cut process operation through the opening 132 is not acceptable. Moreover, forming a gate structure over the dummy fin stress reduction structure 108 might render the dummy fin stress reduction structure 108 electrically active, at least to some degree.

Figure 17:
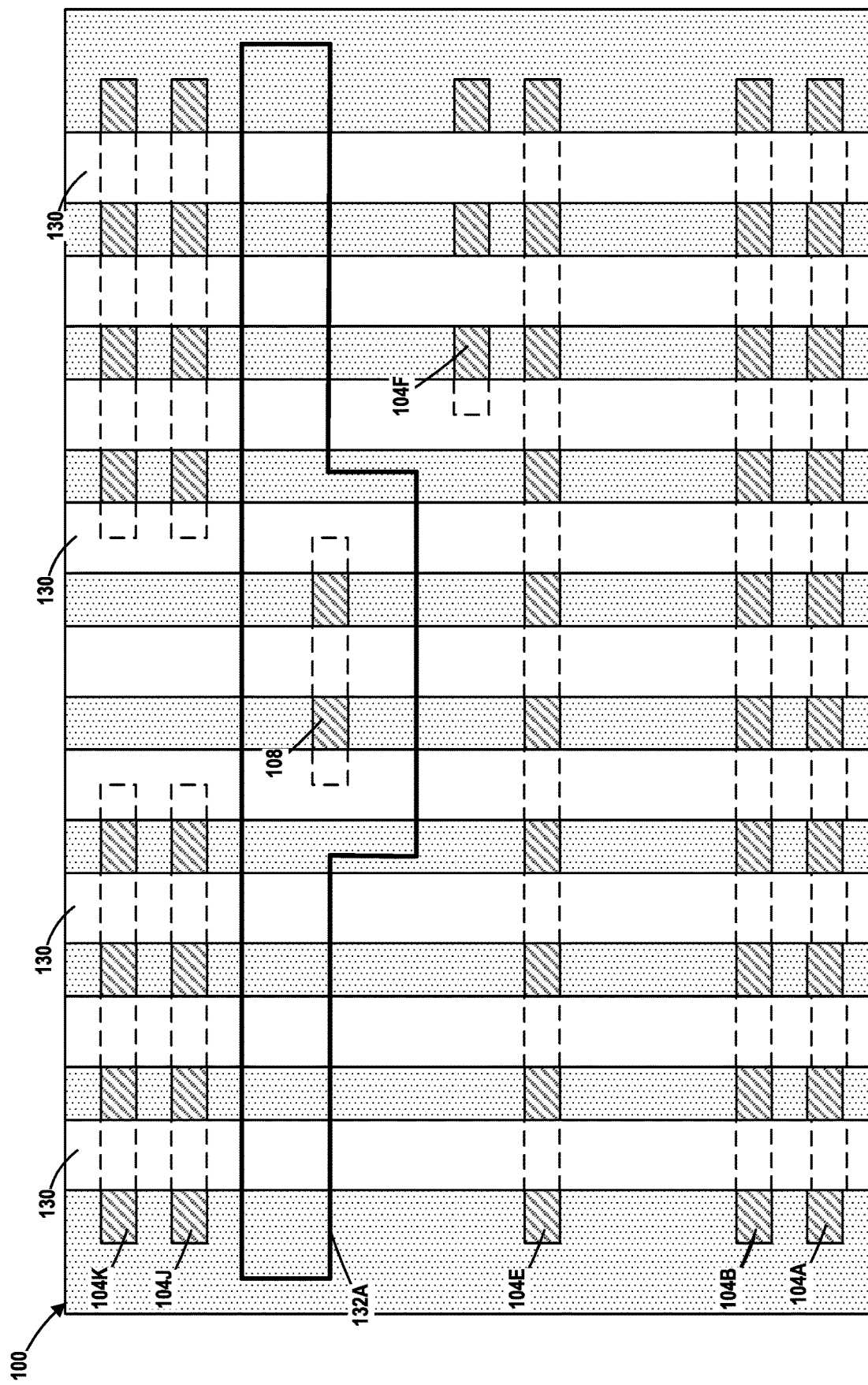

Accordingly, FIG. 17 depicts the IC product after another potential patterned gate-cut masking layer (layer not shown) and the location of an opening 132A where the gates 130 will be cut.

Figure 18:
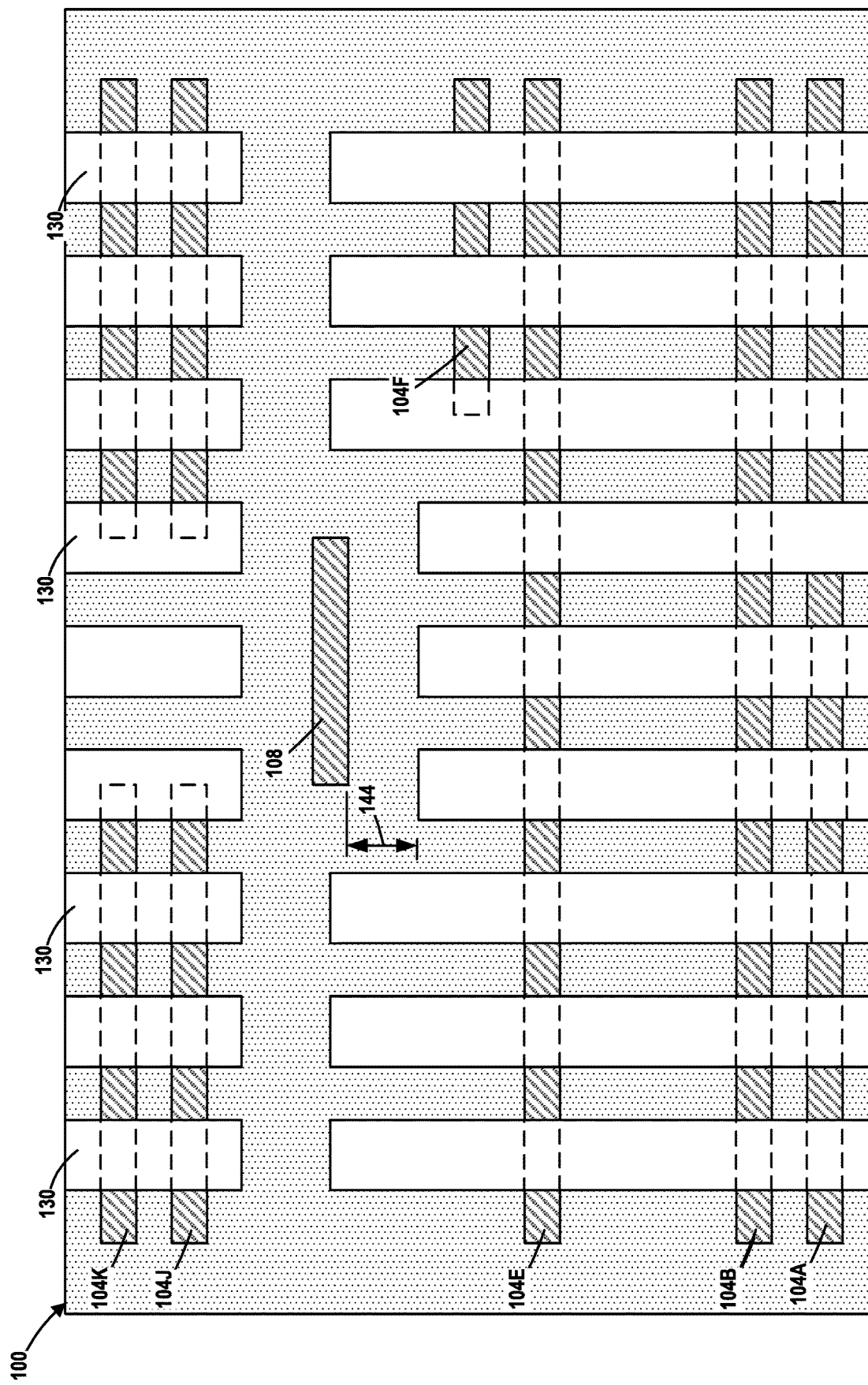

FIG. 18 depicts the IC product after the portions of the gates 130 exposed by the opening 132A were removed. As depicted, the cut ends of the gates 130 adjacent the dummy fin stress reduction structure 108 have been moved farther away from the dummy fin stress reduction structure 108 by a distance 144, thereby eliminating the above-noted problems with the formation of an undesirable capacitor structures. For the embodiment shown in FIGS. 12-18, simulation data indicates that formation of the dummy fin stress reduction structure 108 may reduce the maximum strain energy density (MPa) on the single active fin 104E by as much as about 5% and may reduce the average strain energy density (MPa) on the single active fin 104E by about 7%. Moreover, the strain reduction may occur along the axial length (in the gate length direction) of the single active fin 104E for a dimension that is greater than the axial length 108L (see FIG. 4) of the dummy fin stress reduction structure 108.

As noted above, in one illustrative embodiment, the dummy fin stress reduction structure 108 is electrically inactive with respect to the current flow though the single-fin FinFET device or devices that will comprise the single active fin, i.e., current will not flow through the dummy fin stress reduction structure 108 to any part of the metallization system (or wiring system) on the IC product. The dummy fin stress reduction structure 108 is also electrically inactive with respect to the current flow through any other FinFET device or devices on the IC product irrespective of the number of fins on those other FinFET devices.

The dummy fin stress reduction structure 108 may be rendered electrically inactive by a variety of different techniques which may be employed separately and/or employed in combination. For example, a gate 130 may not be formed above the electrically inactive dummy fin stress reduction structure 108 (as shown in FIG. 8). In other cases. no conductive source/drain metallization structures (such as trench silicide regions—not shown) are formed to contact the electrically inactive dummy fin stress reduction structure 108 under any circumstance so that charge carries (e.g., electrons or holes) do not flow through the electrically inactive dummy fin stress reduction structure 108 when the single-fin transistor device is turned "ON" or when any other FinFET device on the IC product is turned "ON." Even in the situation where an active conductive gate structure 131 is formed over the dummy fin stress reduction structure 108 (as shown in FIGS. 6 and 7), there are no conductive source/drain metallization structures (such as trench silicide regions—not shown) formed so as to contact the dummy fin stress reduction structure 108. To the extent that an active gate structure 131 is formed above the dummy fin stress reduction structure 108 and a capacitor is created between the dummy fin stress reduction structure 108 and the active gate structure 131, that situation shall be understood to be a situation where the dummy fin stress reduction structure 108 is still electrically inactive with respect to the electrical operation of the single-fin FinFET device, i.e., electrically inactive with respect to current flow though the single-fin FinFET device. Thus, as used herein and in the appended claims, the terminology "electrically inactive" shall be understood to have the above meaning.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:
1. A device, comprising:
a semiconductor substrate;
a FinFET transistor device positioned above the semiconductor substrate, the FinFET transistor device having a single active fin structure;
an electrically inactive dummy fin structure positioned adjacent the single active fin structure of the FinFET transistor device, the electrically inactive dummy fin structure being electrically inactive with respect to electrical operation of the FinFET transistor having the single active fin structure, wherein the electrically inactive dummy fin structure is not contacted by any conductive structure;

a first isolation structure including a first trench positioned between the single active fin structure of the FinFET transistor device and the electrically inactive dummy fin structure, wherein the first trench is filled with an insulating material having a first vertical thickness; and a second isolation structure including a second trench positioned between the electrically inactive dummy fin structure and another fin structure, wherein the second trench is filled with an insulating material having a second vertical thickness greater than the first vertical thickness of the first trench.

2. The device of claim 1, wherein the single active fin structure has first and second opposing sidewalls, wherein the first sidewall is positioned nearer to the second isolation structure than the second sidewall and wherein the electrically inactive dummy fin structure is positioned adjacent the first sidewall, wherein, when viewed from above, at least a portion of the electrically inactive dummy fin structure is positioned between the single active fin structure and the second isolation structure.

3. The device of claim 1, wherein the second isolation structure has a first length in a direction corresponding to a gate length direction of the FinFET transistor, and wherein the electrically inactive dummy fin structure has a second length in the direction corresponding to the gate length direction of the FinFET transistor, and wherein the first length and the second length are substantially the same.

4. The device of claim 1, wherein the second isolation structure has a first length in a direction corresponding to a gate length direction of the FinFET transistor, and wherein the electrically inactive dummy fin structure has a second length in the direction corresponding to the gate length direction of the FinFET transistor, and wherein the first length and the second length are different.

5. The device of claim 1, wherein the second isolation structure has a first length in a direction corresponding to a gate length direction of the FinFET transistor, and wherein the electrically inactive dummy fin structure has a second length in the direction corresponding to the gate length direction of the FinFET transistor, and wherein the first length is greater than the second length.

6. The device of claim 1, wherein the single active fin structure is formed with a first fin pitch and wherein the electrically inactive dummy fin structure is positioned a distance equal to a single first fin pitch away from the single active fin structure.

7. The device of claim 1, further comprising a gate structure positioned around the single active fin and the electrically inactive dummy fin structure.

8. The device of claim 1, further comprising a gate structure positioned around the single active fin, wherein the gate structure is not positioned around the electrically inactive dummy fin structure.

9. A device, comprising:
a FinFET transistor device, the FinFET transistor device having a single active fin structure;
an electrically inactive dummy fin structure, wherein the electrically inactive dummy fin structure is electrically inactive with respect to electrical operation of the FinFET transistor having the single active fin structure, and wherein the electrically inactive dummy fin structure is not contacted by any conductive structure;

a first isolation structure including a first trench positioned between the electrically inactive dummy fin structure and the single active fin structure of the FinFET transistor device, wherein the first trench is filled with an insulating material having a first vertical thickness; and a second isolation structure including a second trench positioned between the electrically inactive dummy fin structure and another fin structure, wherein the second trench is filled with an insulating material having a second vertical thickness greater than the first vertical thickness of the first trench.

10. The device of claim 9, wherein the electrically inactive dummy fin structure is positioned in a first cell of an integrated circuit product and the single active fin structure is positioned in a second cell of the integrated circuit product.

11. The device of claim 9, wherein the second isolation structure has a first length in a direction corresponding to a gate length direction of the FinFET transistor and the electrically inactive dummy fin structure has a second length in the direction corresponding to the gate length direction of the FinFET transistor, and wherein the first length and the second length are substantially the same.

12. The device of claim 9, wherein the second isolation structure has a first length in a direction corresponding to a gate length direction of the FinFET transistor and the electrically inactive dummy fin structure has a second length in the direction corresponding to the gate length direction of the FinFET transistor, and wherein the first length and the second length are different.

13. The device of claim 9, wherein the second isolation structure has a first length in a direction corresponding to a gate length direction of the FinFET transistor and the electrically inactive dummy fin structure has a second length in the direction corresponding to the gate length direction of the FinFET transistor, and wherein the first length is greater than the second length.

14. The device of claim 9, wherein the single active fin structure is formed with a first fin pitch and wherein the electrically inactive dummy fin structure is positioned a distance equal to a plurality of first fin pitches away from the single active fin structure.

15. The device of claim 9, further comprising a gate structure positioned around the single active fin, wherein the gate structure is not positioned around the electrically inactive dummy fin structure.

16. A device, comprising:
a semiconductor substrate;
a first isolation structure positioned in the semiconductor substrate;
a second isolation structure positioned in the semiconductor substrate;
a FinFET transistor device positioned above the semiconductor substrate, the FinFET transistor device having a single active fin structure, wherein the single active fin structure of the FinFET transistor device has first and second opposing sidewalls and wherein the first sidewall is positioned nearer to the second isolation structure than the second sidewall; and
an electrically inactive dummy fin structure positioned adjacent the first sidewall of the single active fin structure of the FinFET transistor device, the electrically inactive dummy fin structure being electrically inactive with respect to electrical operation of the FinFET transistor having the single active fin structure, wherein the electrically inactive dummy fin structure is not contacted by any conductive structure, wherein the first isolation structure includes a first trench positioned between the electrically inactive dummy fin structure and the single active fin structure of the FinFET transistor device, wherein the first trench is filled with an insulating material having a first vertical thickness; and wherein the second isolation structure includes a second trench positioned between the electrically inactive dummy fin structure and another fin structure, wherein the second trench is filled with an insulating material having a second vertical thickness greater than the first vertical thickness of the first trench.

17. The device of claim 16, wherein, when viewed from above, at least a portion of the electrically inactive dummy fin structure is positioned between the single active fin structure and the isolation structure.

* * * * *